(12) United States Patent
Sin et al.

(10) Patent No.: US 12,166,853 B2
(45) Date of Patent: Dec. 10, 2024

(54) PUSH-START CRYSTAL OSCILLATOR, ASSOCIATED ELECTRONIC DEVICE AND PUSH-START METHOD FOR PERFORMING START-UP PROCEDURE OF CRYSTAL OSCILLATOR

(71) Applicant: MediaTek Singapore Pte. Ltd., Singapore (SG)

(72) Inventors: Tze Yee Sin, Singapore (SG); Chin-Heng Leow, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 269 days.

(21) Appl. No.: 17/971,650

(22) Filed: Oct. 24, 2022

(65) Prior Publication Data

US 2024/0137197 A1 Apr. 25, 2024
US 2024/0235803 A9 Jul. 11, 2024

(51) Int. Cl.
*H04L 7/00* (2006.01)
*H04L 7/033* (2006.01)

(52) U.S. Cl.
CPC .......... *H04L 7/0016* (2013.01); *H04L 7/0331* (2013.01)

(58) Field of Classification Search
CPC ............................ H04L 7/0331; H04L 7/0016
See application file for complete search history.

(56) References Cited

U.S. PATENT DOCUMENTS

| 7,425,852 | B2 | 9/2008 | Garzarolli |
| 9,246,435 | B1 | 1/2016 | Kavousian |
| 9,509,490 | B1 * | 11/2016 | Dabral ...................... G06F 1/10 |
| 9,515,603 | B2 | 12/2016 | Matsuo |

(Continued)

FOREIGN PATENT DOCUMENTS

| CN | 109845092 A | 6/2019 | |
| CN | 112468110 A | 3/2021 | |
| CN | 114244353 A | * 3/2022 | ............. H03L 7/085 |
| CN | 114785342 A | 7/2022 | |
| TW | 201739168 A | 11/2017 | |
| TW | I628912 B | 7/2018 | |

OTHER PUBLICATIONS

Karim M. Megawer, Nilanjan Pal, Ahmed Elkholy, Mostafa G. Ahmed, Amr Khashaba, Danielle Griffith, Pavan Kumar Hanumolu, "A 54MHz Crystal Oscillator with 30× Start-Up Time Reduction Using 2-Step Injection in 65nm CMOS", ISSCC, 2019, IEEE, USA., 2019.
Chang, U.S. Appl. No. 17/395,439, filed Aug. 5, 2021.

*Primary Examiner* — Thomas J. Hiltunen
*Assistant Examiner* — Khareem E Almo
(74) *Attorney, Agent, or Firm* — Winston Hsu

(57) ABSTRACT

A push-start crystal oscillator (XO), an associated electronic device and a push-start method for performing a start-up procedure of an XO are provided. The push-start XO includes an inverting amplifier and a push-start logic control circuit, wherein the inverting amplifier is coupled to a crystal load. The inverting amplifier generates a first XO signal and a second XO signal. The push-start logic control circuit receives a feedback clock from a phase locked loop (PLL), and generates a phase control clock according to the feedback clock, wherein a push phase and a settle phase are specified by the phase control clock. During the settle phase, the PLL calibrates a frequency of the feedback clock according to the second XO signal. During the push phase, the feedback clock is transmitted to the inverting amplifier in order to increase the amplitude of the first XO signal.

20 Claims, 5 Drawing Sheets

(56) References Cited

U.S. PATENT DOCUMENTS

| | | |
|---|---|---|
| 10,135,390 B2 | 11/2018 | Kumar |
| 10,439,556 B2 | 10/2019 | Sachs |
| 10,581,378 B1 | 3/2020 | Verhoef |
| 11,387,781 B1 | 7/2022 | Chang |
| 2009/0015342 A1 | 1/2009 | Kleveland |
| 2016/0308491 A1 | 10/2016 | Elgaard |
| 2018/0302034 A1 | 10/2018 | Ding |
| 2020/0099337 A1 | 3/2020 | Powell |
| 2024/0137197 A1* | 4/2024 | Sin .................... H03B 5/06 |

* cited by examiner

PUSH-START CRYSTAL OSCILLATOR, ASSOCIATED ELECTRONIC DEVICE AND PUSH-START METHOD FOR PERFORMING START-UP PROCEDURE OF CRYSTAL OSCILLATOR

BACKGROUND

The present invention is related to start-up of crystal oscillators (XOs), and more particularly, to a push-start XO, an associated electronic device and a push-start method for performing a start-up procedure of an XO.

For future communications application (e.g. a duty-cycled wireless/wired system), when there is no data to be sent or received, a crystal oscillator (XO) within a communications device may enter a sleep mode (e.g. disable oscillation of the XO) in order to save power; and when there is data to be sent or received, the XO may enter a wake-up mode for startup of oscillation, and then enter a listen mode which has steady oscillation, allowing the communications device to normally send or receive data.

Some fast start-up methods are proposed in related arts. There are some disadvantages, however. For example, behaviors of additional circuits dedicated for the start-up of oscillation need to be calibrated in order to ensure that these circuits are able to efficiently improve the speed of the start-up. Associated calibration of some related arts is time consuming, and is therefore not preferably to be performed every time when the XO enters the wake-up mode from the sleep mode, thereby making performance of the start-up sensitive to environmental factors such as temperature variation. Some related arts propose methods which are capable of spending less time for the calibration mentioned above, but hardware costs of additional calibration circuits are greatly increased.

Thus, there is a need for a novel architecture of a start-up XO and an associated start-up method, in order to improve performance of the start-up of oscillation without introducing any side effect or in a way that is less likely to introduce side effect.

SUMMARY

In view of the above, an objective of the present invention is to provide a push-start crystal oscillator (XO), an associated electronic device and a push-start method for performing a start-up procedure of an XO, in order to improve robustness and efficiency of a start-up procedure without introducing any side effect or in a way that is less likely to introduce side effects.

At least one embodiment of the present invention provides a push-start XO. The push-start XO comprises an inverting amplifier and a push-start logic control circuit, wherein the inverting amplifier is coupled to a crystal load. The inverting amplifier is configured to generate a first XO signal and a second XO signal, wherein amplitude of the first XO signal is less than amplitude of the second XO signal. The push-start logic control circuit is configured to receive a feedback clock from a phase locked loop (PLL), and generate a phase control clock according to the feedback clock, wherein a push phase and a settle phase are specified by the phase control clock. During the settle phase, the PLL is configured to calibrate a frequency of the feedback clock according to the second XO signal. During the push phase, the feedback clock is transmitted to the inverting amplifier in order to increase the amplitude of the first XO signal.

At least one embodiment of the present invention provides an electronic device. The electronic device comprises a PLL and a push-start XO, wherein the push-start XO is coupled to the PLL. The push-start XO comprises an inverting amplifier and a push-start logic control circuit, wherein the inverting amplifier is coupled to a crystal load. The PLL is configured to generate a feedback clock. The inverting amplifier is configured to generate a first XO signal and a second XO signal, wherein amplitude of the first XO signal is less than amplitude of the second XO signal. The push-start logic control circuit is configured to receive the feedback clock from the PLL, and generate a phase control clock according to the feedback clock, wherein a push phase and a settle phase are specified by the phase control clock. During the settle phase, the PLL is configured to calibrate a frequency of the feedback clock according to the second XO signal. During the push phase, the feedback clock is transmitted to the inverting amplifier in order to increase the amplitude of the first XO signal.

At least one embodiment of the present invention provides a push-start method for performing a start-up procedure of an XO. The push-start method comprises: generating a first XO signal and a second XO signal by an inverting amplifier coupled to a crystal load, wherein amplitude of the first XO signal is less than amplitude of the second XO signal; receiving a feedback clock from a PLL and generating a phase control clock according to the feedback clock by a push-start logic control circuit, wherein a push phase and a settle phase are specified by the phase control clock; during the settle phase, calibrating a frequency of the feedback clock according to the second XO signal by the PLL; and during the push phase, transmitting the feedback clock to the inverting amplifier in order to increase the amplitude of the first XO signal.

The push-start XO and the push-start method provided by the embodiments of the present invention can periodically push amplitude of XO signals and settle the frequency of the feedback clock from the PLL. As the PLL is typically included in an overall system, overall hardware costs will not be greatly increased. Thus, the present invention can improve performance of the start-up of oscillation without introducing any side effect or in a way that is less likely to introduce side effect.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
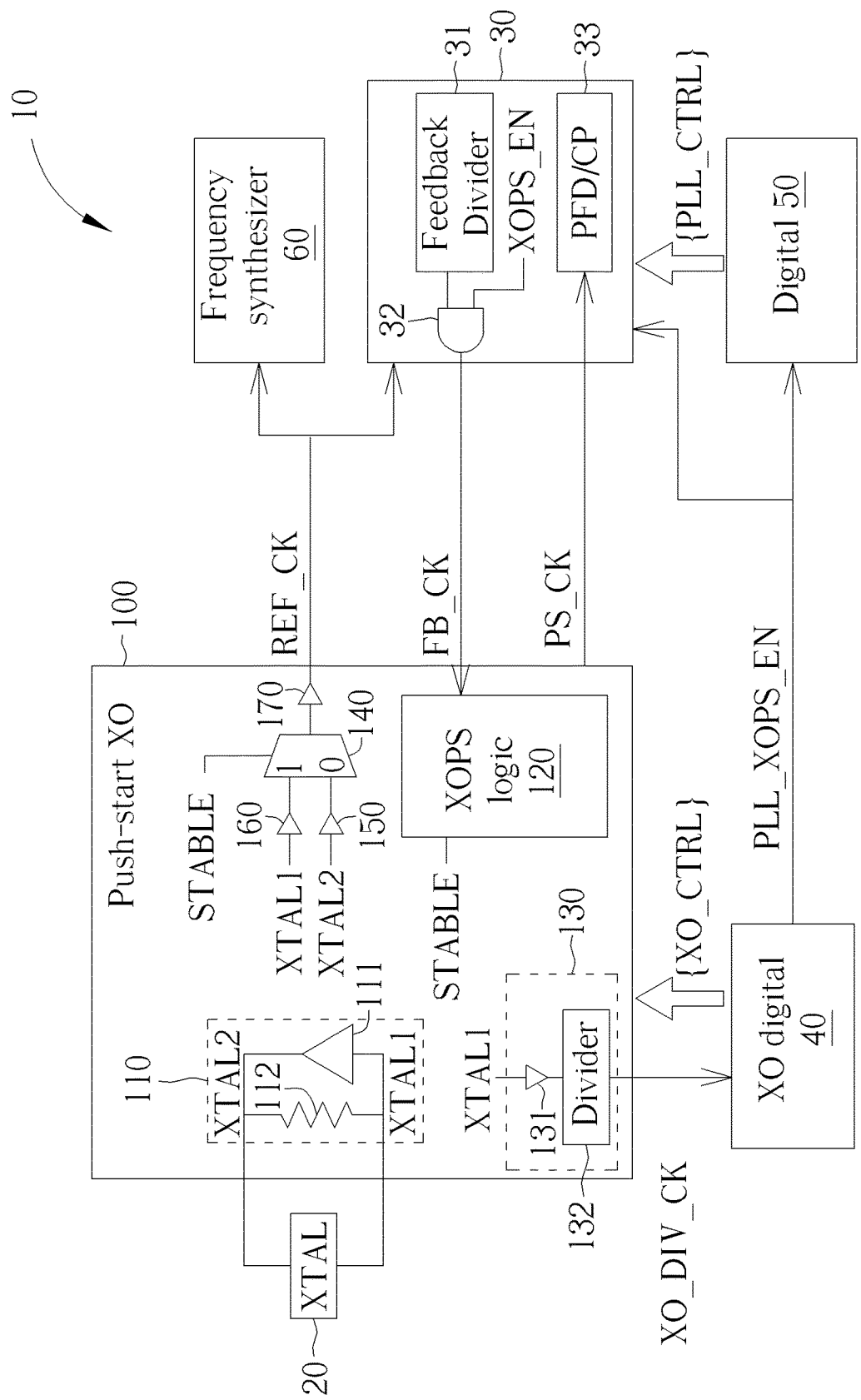
FIG. 1 is a diagram illustrating an electronic device according to an embodiment of the present invention.

FIG. 1 is a diagram illustrating an electronic device 10 according to an embodiment of the present invention. Examples of the electronic device 10 may include, but not limited to: wired communications devices and wireless communications device. As shown in FIG. 1, the electronic device 10 may comprise a push-start crystal oscillator (XO) 100, a crystal load 20 (labeled "XTAL" in FIG. 1 for brevity), a phase locked loop (PLL) 30, digital control circuits such as an XO digital control circuit 40 (labeled "XO digital" in FIG. 1 for brevity) and a digital control circuit 50 (labeled "Digital" in FIG. 1 for brevity), and a frequency synthesizer 60. In some embodiment, the XO digital control circuit 40 may be implemented with a finite state machine (FSM), but the present invention is not limited thereto. The push-start XO 100 is coupled to the PLL 30. The push-start XO 30 may comprise an inverting amplifier 110, a push-start logic control circuit 120 (labeled "XOPS logic" in FIG. 1 for brevity), a peak detector such as a hybrid peak detector 130, a selector 140 (e.g. a multiplexer), a pre-buffering circuit such as a push-start pre-buffer 150, and square wave buffers 160 and 170. In addition, the PLL 30 may comprise a feedback divider 31, a phase-frequency detector (PFD) with a charge pump (collectively referred to as PFD/CP 33 for brevity), and an AND logic gate 32, where the PLL 30 is configured to generate a feedback clock FB_CK to the push-start XO 100. It should be noted that the PLL 30 may further comprise other circuit blocks such as a controllable oscillator (e.g. a voltage controlled oscillator) and a loop filter, where these blocks are well known by those skilled in this art, and are not shown in FIG. 1 for brevity.

In this embodiment, the inverting amplifier 110 may comprise an inverter 111 and a resistor 112, where the resistor 112 is coupled between an input terminal and an output terminal of the inverter 111. As shown in FIG. 1, the inverting amplifier 110 is coupled to the crystal load 20. In particular, the crystal load 20 is coupled between an input terminal (the input terminal of the inverter 111) and an output terminal (the output terminal of the inverter 111) of the inverting amplifier, The inverting amplifier 110 is configured to generate a first XO signal XTAL1 and a second XO signal XTAL2, where the first XO signal XTAL1 is generated on the input terminal of the inverting amplifier 110, and the second XO signal XTAL2 is generated on the output terminal of the inverting amplifier 110.

In this embodiment, the push-start logic control circuit 120 is configured to receive the feedback clock FB_CK from the PLL 30, and generate a phase control clock PS_CK according to the feedback clock FB_CK, where a push phase and a settle phase of a start-up procedure of the push-start XO 100 may be specified by the phase control clock PS_CK. The square wave buffer 160 may transmit the first XO signal XTAL1 to the selector 140, and the push-start pre-buffer 150 may amplify and transmit the second XO signal XTAL2 to the selector 140, where the selector 140 is configured to select one of the first XO signal XTAL1 and the second XO signal XTAL2 for generating a reference clock REF_CK to outside of the push-start XO 100 (to the PLL 30 and the frequency synthesizer 60). In particular, when the start-up procedure of the push-start XO 100 is not completed (e.g. a control signal STABLE has a logic value "0"), the selector 140 may select the second XO signal XTAL2, and the reference clock REF_CK is therefore generated according to the second XO signal XTAL2 by the push-start pre-buffer 150 and the square wave buffer 170. During the settle phase, the PLL 30 is configured to calibrate a frequency of the feedback clock FB_CK according to the second XO signal XTAL2 (e.g. taking the feedback clock FB_CK, which is generated according to the second XO signal XTAL2, as a phase locked reference, thereby making the frequency of the feedback clock FB_CK locked at a frequency of the second XO signal XTAL2). During the push phase, the feedback clock FB_CK, which has been calibrated according to the second XO signal XTAL2, may be transmitted to the inverting amplifier 110 (e.g. via the push-start logic control circuit 120) in order to increase the amplitude of the first XO signal XTAL1 and the second XTAL2. For example, the push-start logic control circuit 120 may transmit the feedback clock FB_CK or a pushing clock having the same frequency as the feedback clock FB_CK to the input terminal or the output terminal of the inverting amplifier 110, but the present invention is not limited thereto. When the start-up procedure of the push-start XO 100 is completed (e.g. the control signal STABLE has a logic value "1"), the selector 140 may select the first XO signal XTAL1, and the reference clock REF_CK is therefore generated according to the first XO signal XTAL1 by the square wave buffers 160 and 170.

Based on a design of the inverting amplifier 110 coupled to the crystal load 20, amplitude of the first XO signal XTAL1 can be less than amplitude of the second XO signal XTAL2, but phase noise of the first XO signal XTAL1 is lower than phase noise of the second XO signal XTAL2. In order to ensure that the amplitude of the first XO signal XTAL1 and the second XTAL2 can be increased by pushing of the feedback clock FB_CK, a frequency error of the feedback clock FB_CK needs to be within a certain range, for example, within ±1500 parts per million (ppm) under 26 megahertz (MHz). At the beginning of the start-up procedure, the amplitude of the first XO signal XTAL1 may be too small to allow the square wave buffers 160 and 170 to generate the reference clock REF_CK meeting a target performance, for example, a frequency error of the reference clock REF_CK may be out of an allowable range, thereby making the feedback clock FB_CK fail to meet the requirement mentioned above. Thus, the second XO signal XTAL2, which has the amplitude greater than the first XO signal XTAL1, may be selected for generating the reference clock REF_CK during the start-up procedure. When the amplitude of the first XO signal XTAL1 reaches a predetermined threshold, for example, greater than 200 millivolt peak-to-peak (mVpp), the start-up procedure may be regarded as completed, and the selector 140 may select the first XO signal XTAL1 for generating the reference clock REF_CK, in order to ensure that phase noise of the reference clock REF_CK to be provided to backend circuit blocks (e.g. the PLL 30 or the frequency synthesizer 60) can meet a target specification (e.g. with phase noise less than a predetermined level).

In this embodiment, the hybrid peak detector 130 is configured to generate a detection clock XO_DIV_CK according to the first XO signal XTAL1, where the XO digital control circuit 40 may receive the detection clock XO_DIV_CK and count a number of pulses (e.g. consecutive pulses) on the detection clock XO_DIV_CK. In particular, the number of pulses on the detection clock XO_DIV_CK may correspond to the amplitude of the first XO signal XTAL1. As shown in FIG. 1, the hybrid peak detector 130 may comprise a buffer 131 (e.g. a de-glitch buffer configured to prevent the first XO signal XTAL1 from being interfered by backend signals) and a divider 132, where the divider 132 is configured to perform frequency division according to the first XO signal XTAL1, to generate the detection clock XO_DIV_CK. For example, the divider 132 may perform the frequency division on output of the buffer 131 to generate the detection clock XO_DIV_CK having a frequency lower than the first XO signal XTAL1, where the frequency of the first XO signal XTAL1 may be 26 MHz, and the frequency of the detection clock XO_DIV_CK may be 32 kilohertz (kHz). Based on this architecture, the divider 132 can act as a de-glitch stage which prevents the first XO signal XTAL1 from being interfered by the processing executed by the XO digital control circuit 40. In addition, the XO digital control circuit 40 can operate under the frequency of the detection clock XO_DIV_CK which is lower than the frequency of the first XO signal XTAL1, thereby reducing power consumption of the XO digital control circuit 40. In some embodiment, the divider 132 may be replaced with other types of de-glitch circuit block(s) without performing the frequency division, but the present invention is not limited thereto.

In detail, the amplitude of the first XO signal XTAL1 may be too small to allow the divider 132 to generate a complete pulse at the beginning. After a few cycles (e.g. four or five cycles) of alternating settle phases and push phases, the amplitude of the first XO signal XTAL1 gradually grows and reaches to a certain level (e.g. a predetermined target level such as 200 mVpp), and the number of the pulses detected on the detection clock XO_DIV_CK also gradually increase and reaches a predetermined threshold (e.g. three or seven pulses). Thus, when the number of pulses on the detection clock reaches the predetermined threshold, the XO digital control circuit 40 may pull up a control signal STABLE from the logic value "0" to the logic value "1", and pull down a control signal PLL_XOPS_EN from the logic value "1" to the logic value "0", indicating that the start-up procedure of the push-start XO 100 is completed.

In detail, when the start-up procedure is not completed, the feedback clock FB_CK transmitted from the PLL 30 to the push-start XO 100 may be enabled in response to the control signal PLL_XOPS_EN being the logic value "1". For example, the AND logic gate 32 may receive a control signal XOPS_EN which is equivalent to the control signal PLL_XOPS_EN and accordingly control enablement of the feedback clock FB_CK. The phase control clock PS_CK transmitted from the push-start logic control circuit 120 to the PLL 30 may be enabled in response to the control signal STABLE being "0", where configuration of the PLL 30 may be determined according to logic values of the phase control clock PS_CK. For example, in response to the phase control clock PS_CK having the logic value "0", corresponding to the settle phase, the PFD/CP 33 may be enabled to make the PLL 30 a close loop, and the frequency of the feedback clock FB_CK is therefore calibrated according to the reference clock REF_CK; and in response to the phase control clock PS_CK having the logic value "1", corresponding to the push phase, the PFD/CP 33 may be disabled to make the PLL 30 an open loop, and the frequency of the feedback clock FB_CK is substantially held at the frequency derived in the settle phase, for pushing the inverting amplifier 110 and making the amplitude of the first XO signal XTAL1 and the second XO signal XTAL2 grow. When the start-up procedure is completed (e.g. the amplitude of the first XO signal XTAL1 is greater than the predetermined threshold), the feedback clock FB_CK may be disabled in response to the control signal PLL_XOPS_EN being the logic value "0", and the phase control clock PS_CK may be disabled in response to the control signal STABLE being "1".

In this embodiment, the XO digital control circuit 40 may control enablement and settings of one or more circuit blocks within the push-start XO 100 via multiple control signals {XO_CTRL}, and the digital control circuit 50 may control enablement and settings of one or more circuit blocks within the PLL 30 and/or the frequency synthesizer 60 via multiple control signals {PLL CTRL}, where the control signal STABLE may be included in the control signals {XO_CTRL}, but the present invention is not limited thereto.

Figure 2:
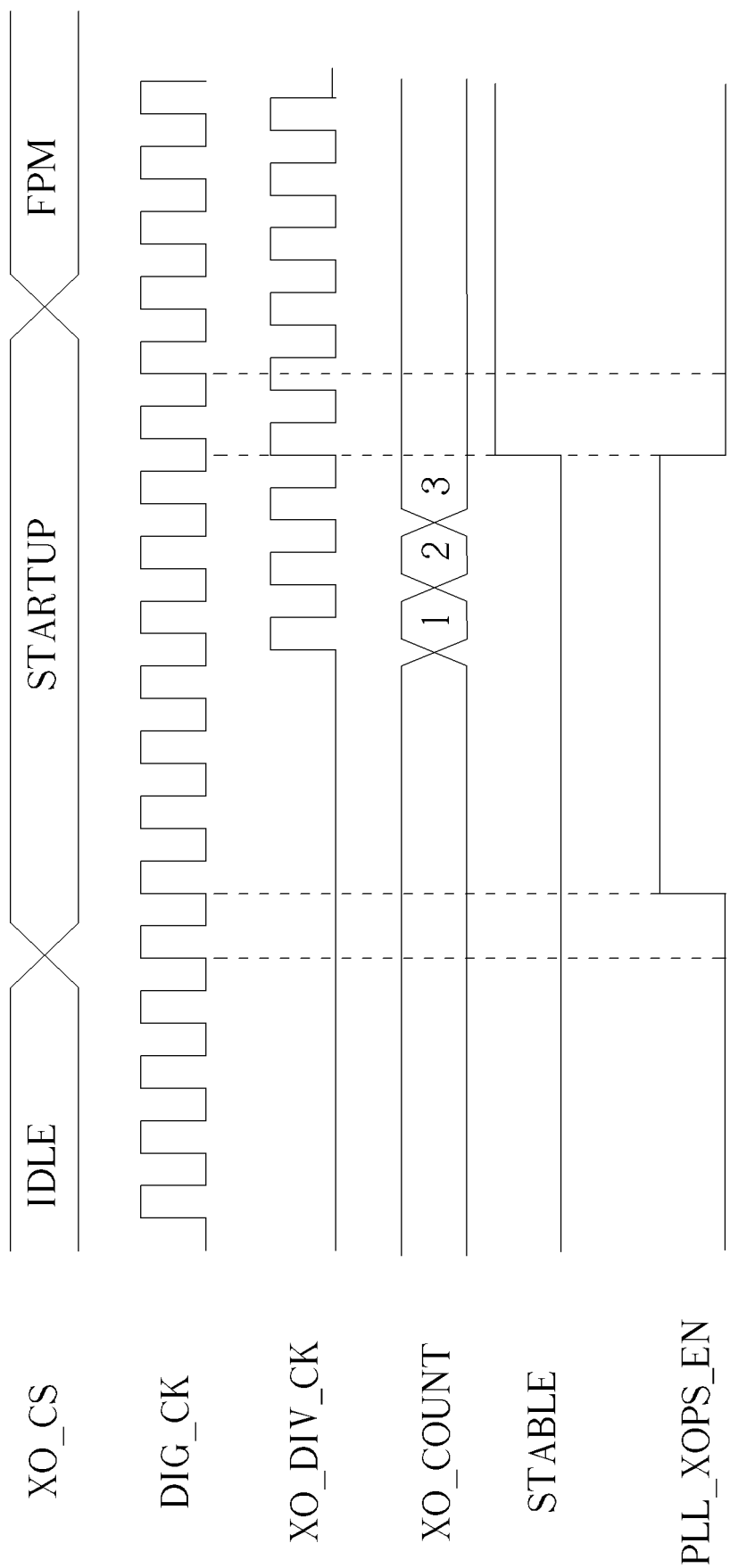
FIG. 2 is a diagram illustrating some signals and clocks according to an embodiment of the present invention.

FIG. 2 is a diagram illustrating some signals and clocks such as XO_CS, DIG_CK, XO_DIV_CK, XO_COUNT, STABLE, STABLE_SYNC and PLL_XOPS_EN according to an embodiment of the present invention. The control signal XO_CS may indicate an operating state of the electronic device 10. The system clock DIG_CK is a stable clock which is always enabled no matter whether the push-start XO 100 is in a sleep mode or a wake-up mode. The counting result signal XO_COUNT indicates the number of pulses detected on the detection clock XO_DIV_CK. In addition, the detection clock XO_DIV_CK, the control signal STABLE and the control signal PLL_XOPS_EN which are described in the embodiment of FIG. 1 are shown in FIG. 2 for better comprehension.

In this embodiment, the push-start XO 100 operates in the sleep mode at the beginning as indicated by the control signal XO_CS having a first state, which is labeled "IDLE" in FIG. 2, where the control signals STABLE and STABLE_SYNC have the logic value "0", and the control signal PLL_XOPS_EN has the logic value "0". When the push-start XO 100 needs to be awakened, the control signal XO_CS may be turned to have a second state, which is labeled "STARTUP" in FIG. 2, and the control signal PLL_XOPS_EN may be pulled up to the logic value "1" after one cycle of the system clock DIG_CK later than the control signal XO_CS being switched, to initiate the start-up procedure of the push-start XO 100. As mentioned in the embodiment of FIG. 1, the amplitude of the first XO signal XTAL1 is too small to allow the hybrid peak detector 130 to generate any pulse on the detection clock XO_DIV_CK at the beginning of the start-up procedure. After a few cycles (e.g. four or five cycles) of alternating settle phases and push phases, the amplitude of the first XO signal XTAL1 grows and is able to trigger the hybrid peak detector 130 to generate pulses on the detection clock XO_DIV_CK, and the number of pulses detected by the XO digital control circuit 40 may start accumulating as illustrated by the counting result signal XO_COUNT. In response to the counting result signal XO_COUNT reaching a predetermined threshold such as three or seven (which may vary according to the target amplitude of the first XO signal XTAL1), the control signal STABLE may be pulled up to the logic value "1" to indicate that the reference clock REF_CK is available, and the control signal PLL_XOPS_EN may be pulled down to the logic value "0", in order to disable some circuit blocks (e.g. the PLL 30, the push-start logic control circuit 120 and/or the hybrid peak detector 130) which are not required in subsequent operations. After one or more cycles of the system clock DIG_CK later than the control signal STABLE being pulled up to the logic value "1", the start-up procedure can be regarded as completed, and the control signal XO_CS may be switched to a third state, which is labeled "FPM" in FIG. 2, for the push-start XO 100 to operate in a normal mode, where a supply voltage of the push-start XO 100 may be switched from a first voltage level to a second voltage level (which is lower than the first voltage level) in response to the control signal XO_CS being switched to the third state, in order to save power consumption of the push-start XO 100, but the present invention is not limited thereto.

Figure 3:
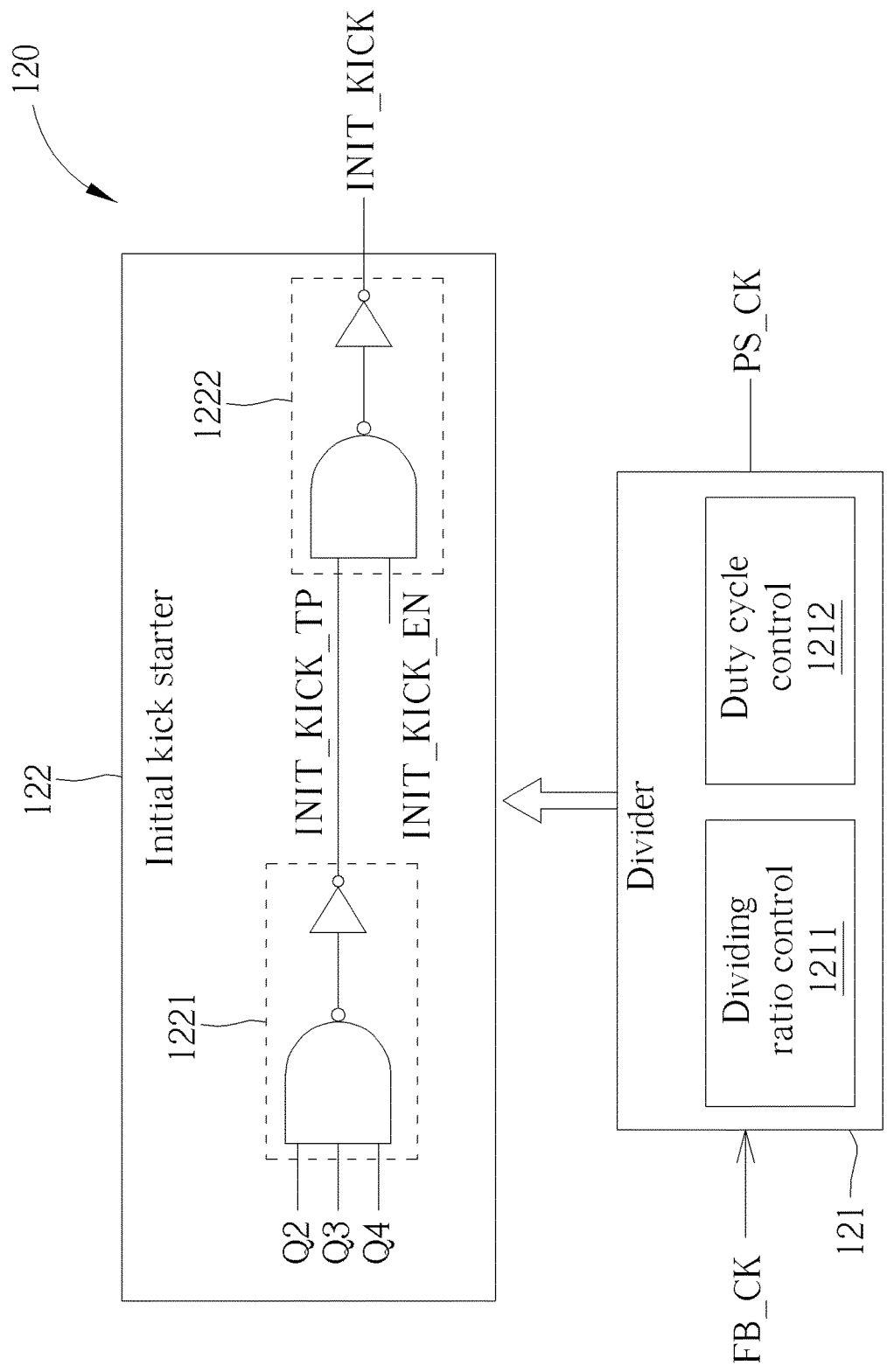
FIG. 3 is a diagram illustrating detailed implementation of a push-start logic control circuit according to an embodiment of the present invention.

FIG. 3 is a diagram illustrating detailed implementation of the push-start logic control circuit 120 according to an embodiment of the present invention. In this embodiment, the push-start logic control circuit 120 may comprise a divider 121, where the divider 121 may comprise a dividing ratio control circuit 1211 and a duty cycle control circuit 1212. The divider is configured to perform frequency division on the feedback clock FB_CK, to generate the phase control clock PS_CK. The dividing ratio control circuit 1211 is configured to control a dividing ratio of the frequency division performed by the divider 121 (e.g. a ratio between the frequency of the feedback clock FB_CK and the phase control clock PS_CK). The duty cycle control circuit 1212 is configured to control a duty cycle of the phase control clock PS_CK. As mentioned in the embodiment of FIG. 1, the logic value "0" and the logic value "1" of the phase control clock PS_CK may correspond to the settle phase and the push phase, respectively, and therefore time periods of the push phase and the settle phase can be determined by the dividing ratio of the frequency division and the duty cycle of the phase control clock PS_CK. In some embodiment, the dividing ratio of the frequency division and the duty cycle of the phase control clock are programmable. For example, the divider 121 may further comprise multiple flip-flops connected in series, and outputs of these flip-flops may be frequency division results with different dividing ratios, where an output of a flip-flop to be selected from these flip-flops may be controlled by the dividing ratio control circuit 1211, in order to determine the dividing ratio of the divider 121, but the present invention is not limited thereto. In addition, the divider 121 may further comprise one or more programmable delay cells in order to determine the duty cycle of the phase control clock PS_CK, where a delay of the programmable delay cell may be controlled by the duty cycle control circuit 1212, but the present invention is not limited thereto.

In addition, even though the second XO signal XTAL2, which has greater amplitude than the first XO signal XTAL1, is selected for generating the reference clock REF_CK, the amplitude of the second XO signal XTAL2 may still be insufficient to ensure that the reference clock REF_CK is stable (e.g. full range toggling such as rail-to-rail toggling with an accurate frequency). Thus, the push-start logic control circuit 120 may further comprise a kick starter such as an initial kick starter 122, which is configured to generate a kick-start control signal INIT_KICK for specifying a kick-start phase before the operation of the settle phase is first time executed. During the kick-start phase, the feedback clock FB_CK from the PLL 30 may be transmitted to the inverting amplifier 110 in order to cause an initial increment of the amplitude of the first XO signal. Thus, phases of the start-up procedure may be executed in the order of: the kick-start phase with the PLL 30, which is free-running at the beginning of the start-up procedure (e.g. the frequency of the feedback clock FB_CK is not self-calibrated yet, and therefore has a frequency error out of the allowable range mentioned in the previous embodiment) due to process-voltage-temperature (PVT) variation; a first time settle phase with the second XO signal XTAL2, which derives the initial increment during the kick-start phase; a first time push phase with the PLL 30, which is locked during the first time settle phase; a second time settle phase; a second time push phase; and so on.

As mentioned above, the inverting amplifier 110 receives the feedback clock FB_CK from the free-running PLL 30 during the kick-start phase. In order to prevent the amplitude of the first XO signal XTAL1 and the second XTAL2 degrades due to the frequency error of the feedback clock FB_CK, the time period of the kick-start phase is controlled to be less than the time period of the push phase. For example, the time period of the settle phase may be 5 microseconds (μs), the time period of the push phase may be 15 μs, where the time period of the kick-start phase may be 352 nanoseconds (ns) or 176 ns. With the configuration of reduced duration of the kick-start phase, the number of pulses of the feedback clock FB_CK transmitted to the inverting amplifier 110 may be reduced in comparison with the push phase, where the start-up procedure may proceed with the first time settle phase under a condition where the degradation of the amplitude of the first XO signal XTAL1 and the second XO signal XTAL2 caused by the frequency error do not occur or less likely to occur. In this embodiment, the initial kick starter 122 may generate the kick-start control signal INIT_KICK according to one or more intermediate-state signals (e.g. one or more outputs of the flip-flops within the divider 121) such as divided clocks Q2, Q3, Q4 from the divider 512. The divided clocks Q2, Q3 and Q4 may be frequency division results of divided-by-8, divided-by-16 and divided-by-32, respectively, but the present invention is not limited thereto. As shown in FIG. 3, the initial kick starter 122 may comprise AND logic gates 1221 and 1222, where each of the AND logic gates 1221 and 1222 may comprise a NAND logic gate and an inverter. In this embodiment, the AND logic gate 1221 may perform an AND logic operation on the divided clocks Q2, Q3 and Q4 to generate a temporary kick-start control signal INIT_KICK_TP, which specify a duration of the kick-start phase. The AND logic gate 1222 may perform an AND logic operation on the temporary kick-start control signal INIT_KICK_TP and a kick-start enablement signal INIT_KICK_EN to generate the kick-start control signal INIT_KICK, which clearly specifies the timing of the kick-start phase. In some embodiment, the push-start logic control circuit 120 may further comprise a selector (not shown), such as a multiplexer, configured to choose one of the kick-start control signal INIT_KICK and the phase control signal PS_CK according to whether the start-up procedure is in the kick-start phase or the push phase, but the present invention is not limited thereto.

Figure 4:
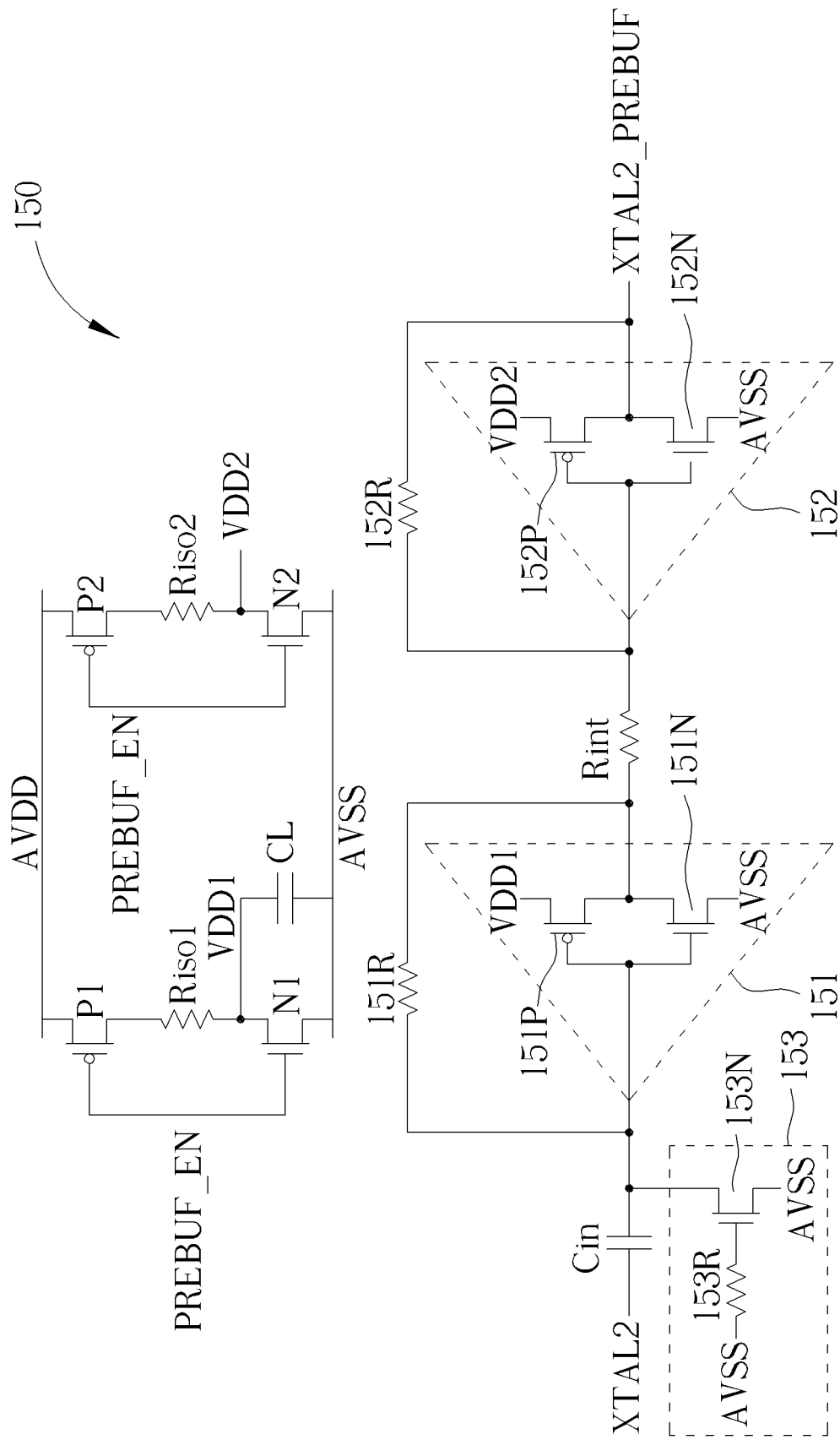
FIG. 4 is a diagram illustrating a pre-buffering circuit according to an embodiment of the present invention.

FIG. 4 is a diagram illustrating detailed implementation of the push-start pre-buffer 150 according to an embodiment of the present invention. In addition to multiple manners for dealing with the problem of signals (e.g. the first XO signal XTAL1 and the second XO signal XTAL2) from the inverting amplifier 110 being too small to ensure the quality of the reference clock REF_CK meets the requirement, the push-start pre-buffer 150 shown in FIG. 4 can further improve robustness and performance of the start-up procedure. In this embodiment, the push-start pre-buffer 150 is configured to amplify the amplitude of the second XO signal XTAL2. As shown in FIG. 4, the push-start pre-buffer 150 may comprise a first inverting amplifier and a second inverting amplifier connected in series via an intermediate resistor Rint. The first inverting amplifier may comprise an inverter 151 and a resistor 151R coupled between an input terminal and an output terminal of the inverter 151, where the inverter 151 may comprise a P-type metal-oxide-semiconductor field-effect transistor (PMOS) 151P and an N-type metal-oxide-semiconductor field-effect transistor (NMOS) 151N. The second inverting amplifier may comprise an inverter 152 and a resistor 152R coupled between an input terminal and an output terminal of the inverter 152, where the inverter 152 may comprise a PMOS 152P and an NMOS 152N. The first inverting amplifier may receive the second XO signal XTAL2 via an input capacitor Cin by alternating current (AC) coupling, and after the second XO signal XTAL2 is amplified by the first inverting amplifier, an amplified result of the first inverting amplifier may be transmitted to the second inverting amplifier via the intermediate resistor Rint for a second stage amplification. By the second stage amplification of the second inverting amplifier, a final amplified result XTAL2_PREBUF may be output for generating the reference clock REF_CK. As an overall gain provided by the push-start pre-buffer 150 is divided into two stages (i.e. the first inverting amplifier and the second inverting amplifier), stability of the push-start pre-buffer 150 can be improved in comparison with a single-stage amplifier having the same overall gain. In addition, the crystal load 20 may be coupled to the inverting amplifier 110 via input/output pads on a circuit board, and an electrostatic discharge (ESD) protection device 153 may be coupled to the input terminal of the first inverting amplifier, where the ESD protection device 153 may comprise a grounded-gate NMOS (ggNMOS), such as an NMOS 153N having a source terminal coupled to a ground voltage AVSS and a resistor 153R coupled between the ground voltage AVSS and a gate terminal of the NMOS 153N.

In this embodiment, power of the first inverting amplifier and the second inverting amplifier may be received from different sources. For example, the inverter 151 may be coupled to a supply voltage VDD1, and the inverter 152 may be coupled to a supply voltage VDD2. In particular, the push-start pre-buffer 150 may further comprise a first power switch, where the first power switch may comprise a PMOS P1 coupled to a supply voltage AVDD, an isolation resistor Riso1 coupled between the PMOS P1 and the first inverting amplifier, and an NMOS N1 coupled between the isolation resistor Riso1 and the ground voltage AVSS. In addition, the push-start pre-buffer 150 may further comprise a second power switch, where the second power switch may comprise a PMOS P2 coupled to the supply voltage AVDD, an isolation resistor Riso2 coupled between the PMOS P2 and the second inverting amplifier, and an NMOS N2 coupled between the isolation resistor Riso2 and the ground voltage AVSS. In this embodiment, gate terminals of the PMOSs P1 and P2 and the NMOSs N1 and N2 are controlled by a pre-buffering enablement signal PREBUF_EN, where the first power switch is configured to provide power from the supply voltage AVDD to the supply voltage VDD1 via the PMOS P1 and the isolation resistor Riso1, and the second power switch is configured to provide power from the supply voltage AVDD to the supply voltage VDD2 via the PMOS P2 and the isolation resistor Riso2. With the aid of the isolation resistors Riso1 and Riso2, the supply voltages VDD1 and VDD2 can be isolated in order to prevent the supply voltages VDD1 and VDD2 from interfering each other or make the supply voltages VDD1 and VDD2 less likely to interfere with each other. When the pre-buffering enablement signal PREBUF_EN has the logic value "1", the push-start pre-buffer 150 may be disabled, and the NMOSs N1 and N2 may be turned on in order to pull down voltage levels of the supply voltages VDD1 and VDD2.

Figure 5:
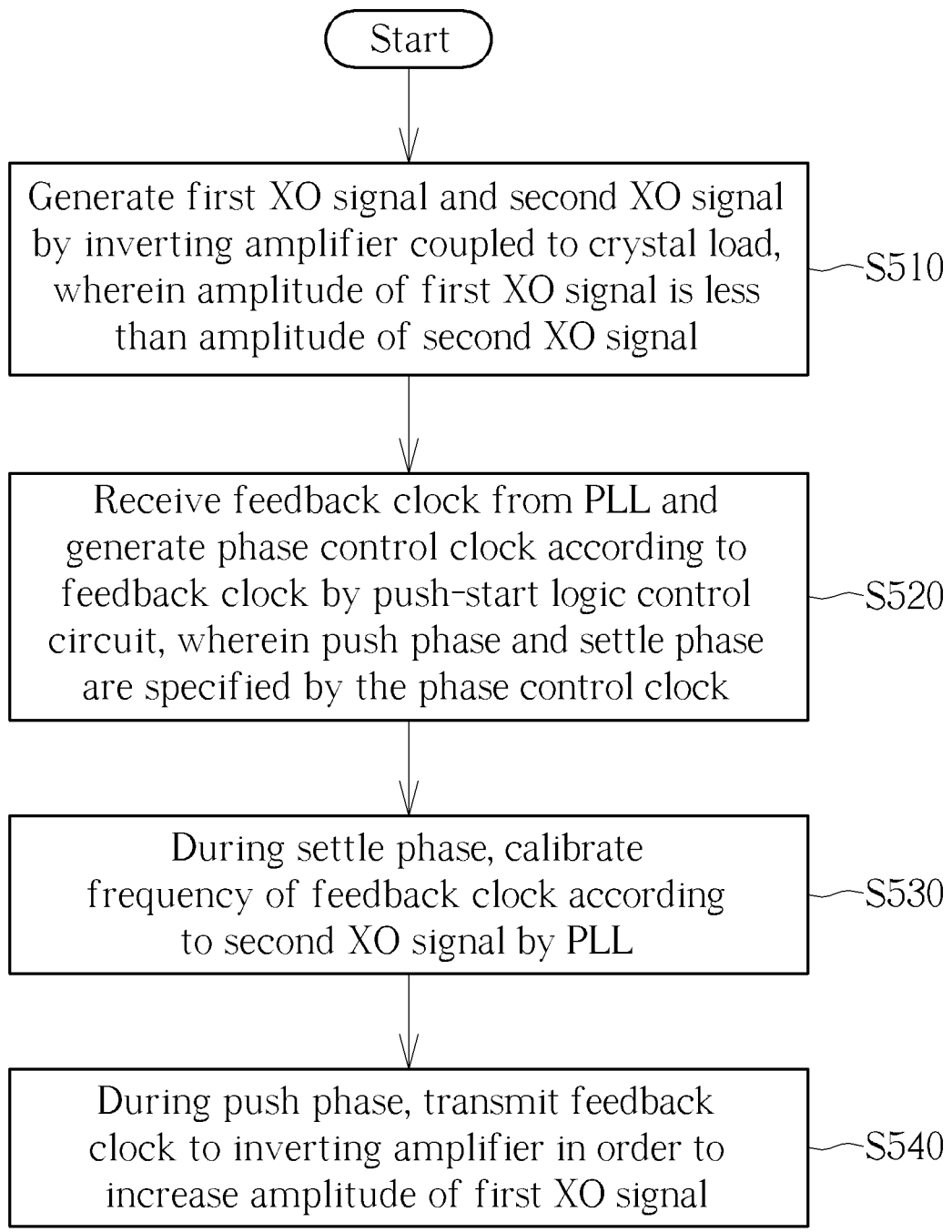
FIG. 5 is a diagram illustrating a working flow of a method for performing a start-up procedure of a crystal oscillator according to an embodiment of the present invention.

FIG. 5 is a diagram illustrating a working flow of a method for performing a start-up procedure of a crystal oscillator such as the push-start XO 100 shown in FIG. 1 according to an embodiment of the present invention, where the method is applicable to the electronic device 10 shown in FIG. 1. It should be noted that the working flow shown in FIG. 5 is for illustrative purposes only, and is not meant to be a limitation of the present invention. One or more steps may be added, deleted or modified in the working flow shown in FIG. 5 if a same result can be obtained. In addition, these steps do not have to be executed in the exact order shown in FIG. 5.

In Step S510, the push-start XO 100 of the electronic device 10 may generate the first XO signal XTAL1 and the second XO signal XTAL2 by the inverting amplifier 110 coupled to the crystal load 20, wherein the amplitude of the first XO signal XTAL1 is less than the amplitude of the second XO signal XTAL2.

In Step S520, the push-start XO 100 of the electronic device 10 may receive the feedback clock from the PLL 30 and generate the phase control clock PS_CK according to the feedback clock FB_CK by the push-start logic control circuit 120, wherein the push phase and the settle phase are specified by the phase control clock.

In Step S530, during the settle phase, the electronic device 10 may calibrate a frequency of the feedback clock FB_CK according to the second XO signal XTAL2 by the PLL 30.

In Step S540, during the push phase, the electronic device 10 may transmit the feedback clock FB_CK to the inverting amplifier 110 in order to increase the amplitude of the first XO signal XTAL1.

To summarize, the embodiments of the present invention utilize a PLL to increase the speed of a start-up procedure of an XO. Even though a control voltage related to a frequency of a feedback clock from the PLL may drift when the PLL operates under an open loop configuration, alternating push phase and settle phase can ensure the frequency of the feedback clock from the PLL is calibrated periodically, maintaining the frequency error in an allowable range. In addition, multiple manners are proposed to solve the problem caused by small amplitude of XO signals at the beginning of the start-up procedure, therefore accuracy of the feedback clock from the PLL can be properly controlled. As the embodiments of the present invention will not greatly increase overall costs, the present invention can improve robustness and efficiency of the start-up procedure without introducing any side effects or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A push-start crystal oscillator (XO), comprising:
    an inverting amplifier, coupled to a crystal load, configured to generate a first XO signal and a second XO signal, wherein amplitude of the first XO signal is less than amplitude of the second XO signal; and
    a push-start logic control circuit, configured to receive a feedback clock from a phase locked loop (PLL), and generate a phase control clock according to the feedback clock, wherein a push phase and a settle phase are specified by the phase control clock;

wherein during the settle phase, the PLL is configured to calibrate a frequency of the feedback clock according to the second XO signal; and during the push phase, the feedback clock is transmitted to the inverting amplifier in order to increase the amplitude of the first XO signal.

2. The push-start XO of claim 1, further comprising:
a peak detector, configured to generate a detection clock according to the first XO signal;
wherein a number of pulses on the detection clock corresponds to the amplitude of the first XO signal.

3. The push-start XO of claim 2, wherein the peak detector comprises:
a divider, configured to perform frequency division according to the first XO signal, to generate the detection clock.

4. The push-start XO of claim 2, wherein when the number of pulses on the detection clock reaches a predetermined threshold, a start-up procedure of the push-start XO is completed.

5. The push-start XO of claim 1, wherein the crystal load is coupled between an input terminal and an output terminal of the inverting amplifier, the first XO signal is generated on the input terminal of the inverting amplifier, and the second XO signal is generated on the output terminal of the inverting amplifier.

6. The push-start XO of claim 1, further comprising:
a selector, configured to select one of the first XO signal and the second XO signal for generating a reference clock to outside of the push-start XO;
wherein when a start-up procedure of the push-start XO is not completed, the second XO signal is selected, and the reference clock is generated according to the second XO signal; and when the start-up procedure of the push-start XO is completed, the first XO signal is selected, and the reference clock is generated according to the first XO signal.

7. The push-start XO of claim 1, wherein the push-start logic control circuit comprises:
a divider, configured to perform frequency division on the feedback clock, to generate the phase control clock;
wherein time periods of the push phase and the settle phase are determined by a dividing ratio of the frequency division and a duty cycle of the phase control clock.

8. The push-start XO of claim 7, wherein the dividing ratio of the frequency division and the duty cycle of the phase control clock are programmable.

9. The push-start XO of claim 1, wherein the push-start logic control circuit comprises:
a kick starter, configured to generate a kick-start control signal for specifying a kick-start phase before an operation of the settle phase is first time executed;
wherein during the kick-start phase, the feedback clock from the PLL is transmitted to the inverting amplifier in order to cause an initial increment of the amplitude of the first XO signal.

10. The push-start XO of claim 9, wherein a time period of the kick-start phase is less than a time period of the push phase.

11. The push-start XO of claim 9, wherein the push-start logic control circuit further comprises:
a divider, configured to perform frequency division on the feedback clock, to generate the phase control clock;
wherein the kick starter generates the kick-start control signal according to one or more intermediate-state signals from the divider.

12. The push-start XO of claim 1, further comprising:
a pre-buffering circuit, configured to amplify the amplitude of the second XO signal, wherein the pre-buffering circuit comprises a first inverting amplifier and a second inverting amplifier connected in series via an intermediate resistor.

13. The push-start XO of claim 12, wherein the pre-buffering circuit further comprises:
a first power switch, configured to transmit power from a supply voltage to the first inverting amplifier; and
a second power switch, configured to transmit the power from the supply voltage to the second inverting amplifier.

14. The push-start XO of claim 13, wherein each of the first power switch and the second power switch comprises:
a P-type transistor, coupled to the supply voltage; and
an isolation resistor, coupled between the P-type transistor and a corresponding one of the first inverting amplifier and the second inverting amplifier.

15. An electronic device, comprising:
a phase locked loop (PLL), configured to generate a feedback clock; and
a push-start crystal oscillator (XO), coupled to the PLL, wherein the push-start XO comprises:
an inverting amplifier, coupled to a crystal load, configured to generate a first XO signal and a second XO signal, wherein amplitude of the first XO signal is less than amplitude of the second XO signal; and
a push-start logic control circuit, configured to receive the feedback clock from the PLL, and generate a phase control clock according to the feedback clock, wherein a push phase and a settle phase are specified by the phase control clock;
wherein during the settle phase, the PLL is configured to calibrate a frequency of the feedback clock according to the second XO signal; and during the push phase, the feedback clock is transmitted to the inverting amplifier in order to increase the amplitude of the first XO signal.

16. A push-start method for performing a start-up procedure of a crystal oscillator (XO), comprising:
generating a first XO signal and a second XO signal by an inverting amplifier coupled to a crystal load, wherein amplitude of the first XO signal is less than amplitude of the second XO signal;
receiving a feedback clock from a phase locked loop (PLL) and generating a phase control clock according to the feedback clock by a push-start logic control circuit, wherein a push phase and a settle phase are specified by the phase control clock;
during the settle phase, calibrating a frequency of the feedback clock according to the second XO signal by the PLL; and
during the push phase, transmitting the feedback clock to the inverting amplifier in order to increase the amplitude of the first XO signal.

17. The push-start method of claim 16, further comprising:
generating a detection clock according to the first XO signal by a peak detector, wherein a number of pulses on the detection clock corresponds to the amplitude of the first XO signal.

18. The push-start method of claim 16, wherein generating the phase control clock according to the feedback clock comprises:
performing frequency division on the feedback clock by a divider to generate the phase control clock, wherein time periods of the push phase and the settle phase are determined by a dividing ratio of the frequency division and a duty cycle of the phase control clock.

19. The push-start method of claim 16, further comprising:

generating a kick-start control signal by a kick starter for specifying a kick-start phase before an operation of the settle phase is first time executed; and during the kick-start phase, transmitting the feedback clock from the PLL to the inverting amplifier in order to cause an initial increment of the amplitude of the first XO signal.

20. The push-start method of claim 16, further comprising:

amplifying the amplitude of the second XO signal by a pre-buffering circuit, wherein the pre-buffering circuit comprises a first inverting amplifier and a second inverting amplifier connected in series via an intermediate resistor.

\* \* \* \* \*